United States Patent [19]

Davis

[11] Patent Number: 4,647,710

[45] Date of Patent: *Mar. 3, 1987

[54] HEAT SENSITIVE CABLE AND METHOD OF MAKING SAME

[75] Inventor: Bayard C. Davis, Lombard, Ill.

[73] Assignee: XCO International, Inc., Elgin, Ill.

[*] Notice: The portion of the term of this patent subsequent to Jan. 1, 2002 has been disclaimed.

[21] Appl. No.: 738,882

[22] Filed: May 23, 1985

Related U.S. Application Data

[63] Continuation of Ser. No. 542,006, Oct. 14, 1983, abandoned, which is a continuation-in-part of Ser. No. 352,979, Feb. 26, 1982, abandoned.

[51] Int. Cl.⁴ ............................................. H01L 35/08
[52] U.S. Cl. ..................................... 136/237; 136/233
[58] Field of Search ............................. 136/230–233, 136/138, 225, 228; 338/20–30, 208, 214, 238–242, 322, 332; 29/573, 611, 612, 613, 614, 624; 73/341

[56] References Cited

U.S. PATENT DOCUMENTS

| | | | |
|---|---|---|---|
| 1,279,252 | 9/1918 | Capp . | |
| 2,081,894 | 5/1937 | Meyer et al. | 201/76 |
| 2,271,975 | 2/1942 | Hall | 201/76 |
| 2,413,125 | 12/1946 | Walbridge | 201/63 |
| 2,470,653 | 5/1949 | Schulman et al. | 201/63 |
| 2,477,348 | 7/1949 | Postal | 201/63 |
| 2,495,867 | 1/1950 | Peters | 18/47.5 |
| 2,511,216 | 6/1950 | Miller | 25/157 |
| 2,586,252 | 2/1952 | Peters | 201/63 |
| 2,619,573 | 11/1952 | Dawson | 201/63 |
| 2,631,116 | 3/1953 | Fox | 136/138 |
| 2,639,247 | 5/1953 | Squier | 154/2.28 |
| 2,664,486 | 12/1953 | Colpitts | 201/63 |
| 2,665,322 | 1/1954 | MacDonald | 136/4 |
| 2,717,945 | 9/1955 | Dresios et al. | 201/63 |
| 2,728,833 | 12/1955 | Dickey | 201/63 |
| 2,740,874 | 4/1956 | Kelly et al. | 338/26 |
| 2,764,659 | 9/1956 | Postal | 201/63 |
| 2,805,272 | 9/1957 | Postal | 136/228 |
| 2,813,425 | 11/1957 | Woolley | 73/341 |
| 2,842,648 | 7/1958 | Reynolds | 338/26 |
| 2,848,587 | 8/1958 | Postal | 201/63 |
| 2,868,935 | 1/1959 | Howatt | 201/63 |
| 2,936,434 | 5/1960 | Postal | 338/26 |
| 2,941,192 | 6/1960 | Postal | 340/228 |

(List continued on next page)

OTHER PUBLICATIONS

Bulletin TT-318, Insulated Thermocouple and Extension Wire, Trinity Equip. Corp. Cortland, N.Y., 6 pages.
Brochure of Alison Control Inc., "Alison Control Has the Answer" (8 pages), undated.

(List Continued on next page)

Primary Examiner—John F. Terapane
Assistant Examiner—T. J. Wallen
Attorney, Agent, or Firm—Wood, Dalton, Phillips, Mason & Rowe

[57] ABSTRACT

A heat sensitive cable capable of generating a temperature representative measurable voltage. The cable includes a pair of thermoelectric conductors disposed in contacting side-by-side relation together with an electrical insulation for passively self-generating a temperature representative measurable voltage between the conductors when the cable is exposed to ambient temperature. A flexible outer jacket formed of an electrically non-conductive material is provided to completely surround the conductors. The electrical insulation causes a change in the temperature representative measurable voltage with an increase or decrease in temperature at every location along the jacket. A change in the temperature representative measurable voltage under such condition is representative of a change in ambient temperature. The electrical insulation also causes a change in the temperature representative measurable voltage with an increase in temperature above the prevailing ambient at any location along the jacket. With this arrangement, the heat sensitive cable may be utilized not only to monitor ambient temperature but also to monitor for any localized increase in temperature.

42 Claims, 15 Drawing Figures

U.S. PATENT DOCUMENTS

| | | | |
|---|---|---|---|
| 3,045,326 | 7/1962 | Griffiths | 29/155.5 |
| 3,069,752 | 12/1962 | Sherning | 29/155.5 |
| 3,089,339 | 5/1963 | Rogers et al. | 73/362 |
| 3,205,296 | 9/1965 | Davis et al. | 174/34 |
| 3,266,001 | 8/1966 | Landis et al. | 338/22 |
| 3,267,733 | 8/1966 | Chambers | 73/362 |
| 3,295,087 | 12/1966 | Landis et al. | 338/28 |
| 3,315,214 | 4/1967 | Davis | 339/94 |
| 3,329,534 | 7/1967 | Adler et al. | 136/233 |
| 3,353,260 | 11/1967 | Davis et al. | 29/573 |
| 3,366,913 | 1/1968 | Davis et al. | 338/322 |
| 3,376,169 | 4/1968 | Davis et al. | 136/230 |
| 3,400,356 | 9/1968 | Davis et al. | 338/208 |
| 3,408,607 | 10/1968 | Davis | 338/26 |
| 3,434,207 | 3/1969 | Frachon | 29/612 |
| 3,441,893 | 4/1969 | Gordon et al. | 338/26 |
| 3,444,740 | 5/1969 | Davis | 73/359 |
| 3,451,861 | 6/1969 | Gordon et al. | 136/230 |
| 3,492,170 | 1/1970 | Davis et al. | 136/233 |
| 3,493,949 | 2/1970 | Servos et al. | 340/228 |
| 3,513,432 | 5/1970 | Davis | 338/28 |
| 3,530,423 | 9/1970 | Davis | 339/89 |
| 3,537,053 | 10/1970 | Snoberger et al. | 338/25 |
| 3,538,596 | 11/1970 | Davis et al. | 29/573 |
| 3,607,447 | 9/1971 | Davis | 136/233 |
| 3,622,901 | 11/1971 | Ledran et al. | 338/35 |
| 3,660,158 | 5/1972 | Chen et al. | 117/217 |
| 3,683,696 | 8/1972 | Vaughan et al. | 73/344 |
| 3,729,343 | 4/1973 | Thomas | 136/225 |
| 3,737,997 | 6/1973 | Davis | 29/624 |
| 3,816,182 | 6/1974 | McAdam | 136/230 |
| 3,831,269 | 8/1974 | Sommer | 29/612 |
| 3,925,104 | 12/1975 | Thomas | 136/225 |
| 4,075,036 | 2/1978 | Lysikov et al. | 136/225 |
| 4,094,061 | 6/1978 | Gupta et al. | 29/612 |
| 4,175,437 | 11/1979 | Burt | 73/362 |
| 4,324,138 | 4/1982 | Davis | 73/341 |
| 4,491,822 | 1/1985 | Davis | 136/230 |

OTHER PUBLICATIONS

Article by Charles Doak of Alison Control Inc. "Integrated Fire Protection for the Modern Generating Station": (4 pages), Instrumentation & Control, undated.

Specification of Alison Control Inc., "9090 Series Continuous Thermister Sensors" (3 pages), 3/6/75 and 9/20/77.

Technical Report of Alison Control Inc., "Technical Report No. 9, 9090 Series Continuous Thermistor Sensor in Nuclear Environments" (6 pages), 11/16/70.

Technical Report of Alison Control Inc., "Technical Report No. 10, Intrinsically Safe Fire Detection Systems" (6 pages), 11/25/70.

Brochure of Fastener Engineers, Inc. "fe Fastener Engineers In-Line Wire Drawing Machines with Mechanical Variable Speed Drives" (8 pages), undated.

Brochure of Fastener Engineers, Inc., "fe Fastener Engineers In-Line Wire Drawing Machines with Hydraulic Variable Speed Drives" (4 pages), 5/77.

Brochure of Kidde Belleville Division of Walter Kidde & Company, Inc., "The Cold Facts . . . About Cryogenic Temperature Detection" (2 pages), 11/79.

Literature of Kidde Belleville Division of Walter Kidde & Company, Inc., "Kidde Continuous Strip Fire Detector" (4 pages), 3/79.

Brochure of Kidde Belleville Division of Walter Kidde & Company, Inc., "Superior Protection for Modern Industry with Kidde Fire and Overheat Continuous Detection Systems" (4 pages), approximately 1/07/80.

Brochure of Kidde Belleville Division of Walter Kidde & Company, Inc., "Karos-A Contemporary Computer-Managed Fire and Security System from Kidde Belleville" (8 pages), undated.

Literature of Walter Kidde & Company, Inc., "K Kidde Discrete Temperature Monitoring Systems" (2 pages), 2/77.

Data Sheets of Walter Kidde & Company, Inc., "Sensing Element Continuous Fire Detector", Data Sheets 1422-05 (2 pages), 1422-10 (2 pages), 1422-25 (2 pages), 1422-30 (2 pages), 1422-67 (2 pages), 1422-77 (2 pages), 1422-87 (2 pages), and 1422-97 (2 pages), undated.

Article by R. C. Rittenhouse, "Fire: Detection and Prevention at Power Plants", Power Engineering, vol. eighty-five No. 2 (pages 42 through 50), Feb., 1981.

Catalog of the Protectowire Co., "Protectorwire Heat Detection in Cable Trays and Associated Facilities (13 pages) undated.

HEAT SENSITIVE CABLE AND METHOD OF MAKING SAME

RELATED APPLICATION

This is a continuation of co-pending application Ser. No. 542,006 filed on Oct. 14, 1983, now abandoned, which is a continuation-in-part of my earlier copending application, Ser. No. 352,979, filed Feb. 26, 1982 now abandoned.

BACKGROUND OF THE INVENTION

The present invention relates to heat sensitive devices and, more particularly, to a heat sensitive cable and method of making same.

Heat sensitive cables which are characterized by the use of semiconductive materials having inverse temperature-resistance characteristics in conjunction with dissimilar thermoelectric conductors are now well known in the art. Such cables are particularly suitable where it is desired to monitor the greatest temperature existing along the length of the cable, and are exemplified in connection with a system for measuring and locating temperature conditions of interest in U.S. Pat. Nos. 3,408,607 and 4,324,138. Thermistor cables which are characterized by a core of semiconductive material surrounded by a mass of temperature-resistant electrically-insulating material covered with a protective metallic sheath are also well known in the art.

Despite the clear advantages and many applications for such cables, they have simply not evolved to the point of providing the desired degree of versatility. It has remained to develop a heat sensitive cable capable of generating a measurable and predictable voltage when the entire length of cable is at ambient, e.g., 72° F., wherein the cable is also adapted to provide a change in the temperature representative measurable voltage with an increase in temperature above the prevailing ambient at any location along the cable. If this could be achieved with an electrical insulation having a negative temperature coefficient, the thermoelectric output of the cable or a section thereof would be altered in a predictable fashion.

Moreover, if this could be achieved, the cable location where an increase in temperature takes place could be located electronically. This could be done, for instance, as fully disclosed and claimed in my earlier U.S. Pat. No. 4,324,138, issued Apr. 13, 1982, for a method of and apparatus and system for determining temperature conditions. As set forth therein, the applications are virtually limitless.

While the value of heat sensitive cable has long been recognized, it has remained to provide such a cable having the requisite versatility for the many applications to be benefited by use thereof. In fact, despite my many prior inventions in this field, as exemplified by U.S. Pat. Nos. 3,408,607 and 3,513,432, the missing link to providing a highly versatile cable has remained. Despite the advantages that will be recognized by those skilled in the art, heat sensitive cable which may not only be utilized to monitor ambient temperature but also may be utilized to monitor for any localized increase above ambient temperature has simply not been available.

It is therefore an object of the present invention to provide a heat sensitive cable having means for generating a temperature representative measurable voltage.

It is also an object of the present invention to provide a cable of the type described utilizing a pair of thermoelectric conductors disposed in contacting side-by-side relation together with means for passively self-generating a temperature representative measurable voltage between the conductors when the cable is exposed to ambient temperature.

It is a further object of the present invention to provide a cable of the type described utilizing a flexible outer jacket formed of an electrically non-conductive material to completely surround the conductors.

It is another object of the present invention to provide a cable of the type described which is not only passive and self-generating to generate a voltage potential between the thermoelectric conductors indicative of the temperature existing along the entire length of the cable, i.e., the ambient temperature, but which also generates a voltage potential between the conductors indicative of the hottest point along the length of the cable if the temperatures are unequal.

It is still another object of the present invention to provide a cable of the type described in which the passive self-generating characteristic causes a change in the temperature representative measurable voltage with an increase or decrease in temperature at every location along the jacket.

It is still another object of the present invention to provide a cable of the type described in which the passive self-generating characteristic causes a change in the temperature representative measurable voltage with an increase in temperature above the prevailing ambient at any location along the jacket.

It is still another object of the present invention to provide a cable of the type described capable of precise, nonperishable, reproducible measurement of the temperature and identification of the location of the hottest spot when monitoring with a high input impedance temperature device.

It is another object of the present invention to provide a cable of the type described wherein the outer jacket and the thermoelectric conductors can be formed of various materials and combinations of materials to yield various mechanical properties and temperature-voltage response curves.

It is a further object of the present invention to provide a cable of the type described which can be produced in lengths of thousands of feet at a fraction of the cost of making other types or constructions of heat sensitive cable.

An additional object of the present invention is to provide a cable of the type described utilizing commercially available materials and processes to manufacture the cable.

These and other objects, advantages and features of the present invention will be apparent from a consideration of the accompanying specification, claims and drawings.

SUMMARY OF THE INVENTION

Accordingly, the present invention is directed to a heat sensitive cable capable of generating a temperature representative measurable voltage. The cable includes a pair of thermoelectric conductors disposed in contacting side-by-side relation together with means for passively self-generating a temperature representative measurable voltage between the conductors when the cable is exposed to ambient temperature. A flexible outer jacket formed of an electrically non-conductive material is provided to completely surround the conductors. The passive self-generating means includes means for causing a change in the temperature representative measurable voltage with an increase or decrease in temperature at every location along the jacket. A change in the temperature representative measurable voltage under such condition is representative of a change in ambient temperature. The passive self-generating means also includes means for causing a change in the temperature representative measurable voltage with an increase in temperature above the prevailing ambient at any location along the jacket. With this arrangement, the heat sensitive cable may be utilized not only to monitor ambient temperature but also to monitor for any localized increase in temperature.

In a preferred embodiment, the passive self-generating means includes an electrical insulation having a negative temperature coefficient disposed on the surface of at least one of the conductors. Preferably, the conductor is coated with a solution of manganese nitrate or the surface of the conductor is covered with heat treated manganese dioxide. By so doing, the resulting electrical insulation which is formed on the surface of the conductor has a negative temperature coefficient and will provide the required temperature representative measurable voltage throughout the desired range of temperatures.

In addition, the pair of thermoelectric conductors disposed in contacting side-by-side relation are advantageously formed of thermoelectrically dissimilar materials. It has been found suitable, for instance, for one of the conductors to be formed of a nickel/chromium alloy and the other of the conductors to be formed of a copper/nickel alloy. Specifically, the nickel/chromium alloy may comprise approximately 90 percent nickel and 10 percent chromium and the copper/nickel alloy may comprise approximately 55 percent copper and 45 percent nickel.

With regard to the flexible outer jacket, it is preferably formed of a material that may be applied to completely surround the conductors in a fashion applying pressure to hold the conductors in contacting side-by-side relation. In this connection, the material may be of a type adapted to be extruded onto the conductors, or a material of the type adapted to be heat shrunk onto the conductors, or a material of the type adapted to be wrapped onto the conductors. Once the material has been applied to the conductors to form the flexible outer jacket, the heat sensitive cable may be stored on spools due to its flexibility and later may be removed and cut to length for use as needed.

With respect to the method of manufacturing the cable, a pair of thermoelectric conductors is initially provided. Next, means are provided for passively self-generating a temperature representative measurable voltage between the conductors when the cable is exposed to ambient temperature. The conductors are then positioned so as to be disposed in contacting side-by-side relation. Finally, a flexible outer jacket formed of an electrically non-conductive material is applied to the conductors so that the conductors are completely surrounded by the jacket. The passive self-generating means is selected so as to include means for causing a change in the temperature representative measurable voltage with an increase or decrease in temperature at every location along the jacket. A change in the temperature representative measurable voltage under such condition is representative of a change in the ambient temperature. The passive self-generating means is also selected so as to include means for causing a change in the temperature representative measurable voltage with an increase in temperature above the prevailing ambient at any location along the jacket. With the manufacturing method of the invention, a heat sensitive cable is provided which may be utilized not only to monitor ambient temperature but also to monitor for any localized increase above ambient temperature.

DETAILED DESCRIPTION OF THE PREFERRED EMBODIMENTS

Figures 1, 2:
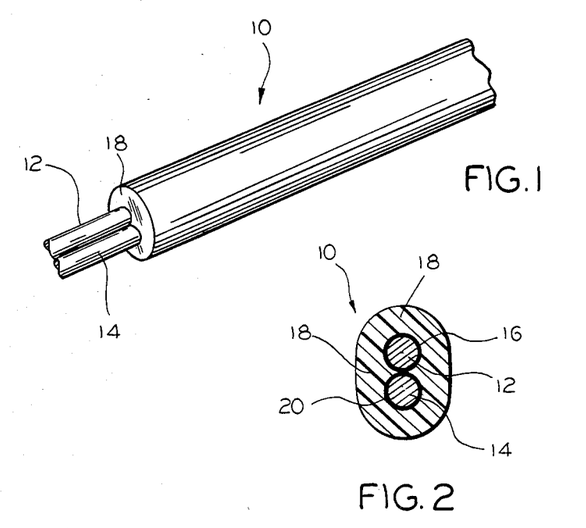
FIG. 1 is a perspective view of a section of heat sensitive cable in accordance with the present invention.
FIG. 2 is a cross sectional view of the cable illustrated in FIG. 1.

Referring to the drawings, and first to FIG. 1, the reference numeral 10 designates generally a heat sensitive cable capable of generating a temperature representative measurable voltage. The cable 10 includes a pair of thermoelectric conductors 12 and 14 disposed in contacting side-by-side relation together with means for passively self-generating a temperature representative measurable voltage between the conductors 12 and 14 when the cable 10 is exposed to ambient temperature. A flexible outer jacket 18 formed of an electrically non-conductive material is provided to completely surround the conductors 12 and 14. The passive self-generating means includes means for causing a change in the temperature representative measurable voltage with an increase or decrease in temperature at every location along the jacket 18. A change in the temperature representative measurable voltage under such condition is representative of a change in ambient temperature. The passive self-generating means also includes means for causing a change in the temperature representative measurable voltage with an increase in temperature above the prevailing ambient at any location along the jacket 18. With this arrangement, the heat sensitive cable 10 may be utilized not only to monitor ambient temperature but also to monitor for any localized increase in temperature.

In a preferred embodiment, the passive self-generating means includes an electrical insulation 16 having a negative temperature coefficient disposed on the surface of at least one of the conductors 12 and 14. Preferably, the conductor 12, for instance, is coated with a solution of manganese nitrate or heat treated manganese dioxide on the order of 2 to 6 mils thick. By so doing, the resulting electrical insulation 16 which is formed on the surface of the conductor 12 will provide the required temperature representative measurable voltage throughout the desired range of temperature.

With regard to the electrical insulation 16, the conductor 12 is provided with a treated surface in one embodiment by coating the conductor 12 with a manganese nitrate solution. After the conductor 12 has been coated with the solution, which is preferably approximately 61 percent manganese nitrate, the conductor is heated to a temperature of between 300° and 450° F. to complete the surface treatment process whereby the conductor 12 has an electrical insulation 16 with a negative temperature coefficient. Moreover, as shown in FIG. 1, the conductor 14 also preferably has an electrical insulation 20 having a negative temperature coefficient provided by a like surface treatment process.

In practice, it has been found advantageous to provide the solution of manganese nitrate by heating manganese nitrate at a temperature of approximately 100° F. The manganese nitrate is heated at this temperature until melted and thereafter the melted manganese nitrate is heated at between approximately 400° to 500° F. for approximately 3 minutes. With this procedure, the manganese nitrate is first reduced from a solid to a thin liquid and is then converted from a thin liquid to a thick, black substance.

Referring to FIG. 2, it will be appreciated that the elements comprising the heat sensitive cable 10 have been exaggerated in size to enhance the illustration. The electrical insulation 16 on the conductor 12 and the electrical insulation 20 on the conductor 14 both comprise very thin surface coatings which are sufficient to permit the conductors 12 and 14 to be disposed in contacting side-by-side relation, but separated and electrically insulated by the thin coatings of electrical insulation 16 and 20. By reason of the intimate electrically insulated contact of the conductors 12 and 14, the heat sensitive cable 10 may be utilized to monitor temperature as indicated in a completely satisfactory manner.

In the embodiment illustrated in FIG. 2, the conductors 12 and 14 disposed in contacting side-by-side relation are formed of thermoelectrically dissimilar materials, e.g., one of the conductors 12 is preferably formed of a nickel/chromium/alloy and the other of the conductors 14 is preferably formed of a copper/nickel alloy. It will be appreciated, however, that all of the embodiments illustrated in the drawings need only be formed of thermoelectrically dissimilar materials, e.g., those commonly known as ANSI K, E, J, or T thermoelectric pairs, or any other conductors formed of thermoelectrically dissimilar materials. Nevertheless, when nickel/chromium and copper/nickel alloys are selected, it has been found advantageous for the nickel/chrome alloy to comprise approximately 90 percent nickel and 10 percent chromium and the copper/nickel alloy to comprise approximately 55 percent copper and 45 percent nickel.

Figure 3:
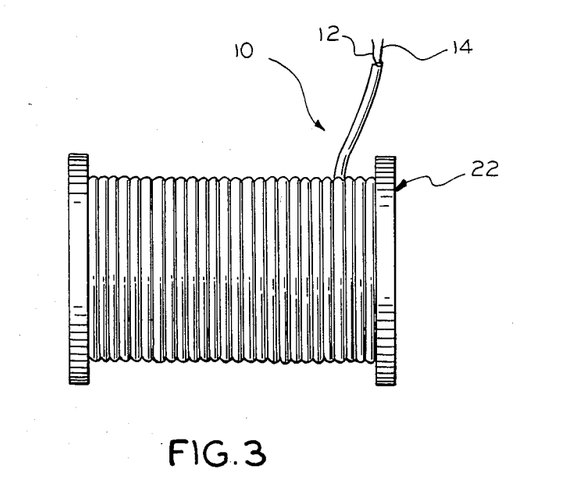
FIG. 3 is an elevational view of a spool containing the cable illustrated in FIG. 1.
Figure 4:
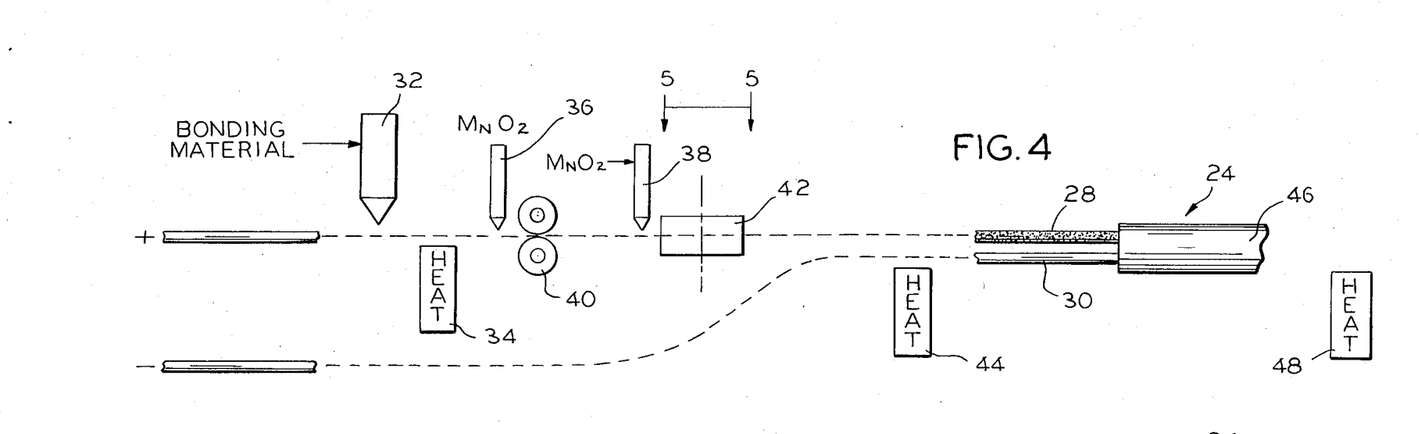
FIG. 4 is a schematic view of a method of manufacturing heat sensitive cable in accordance with the present invention.
Figure 5:
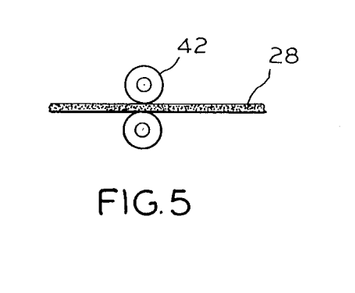
FIG. 5 is a top plan view taken along the line 5—5 of FIG. 4.
Figures 6, 7:
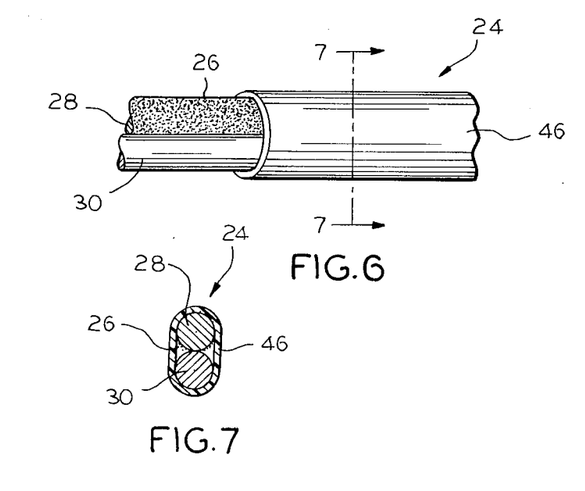
FIG. 6 is an elevational view of a section of heat sensitive cable manufactured in accordance with the method of FIG. 4.
FIG. 7 is a cross sectional view taken along the line 7—7 of FIG. 6.
Figure 8:
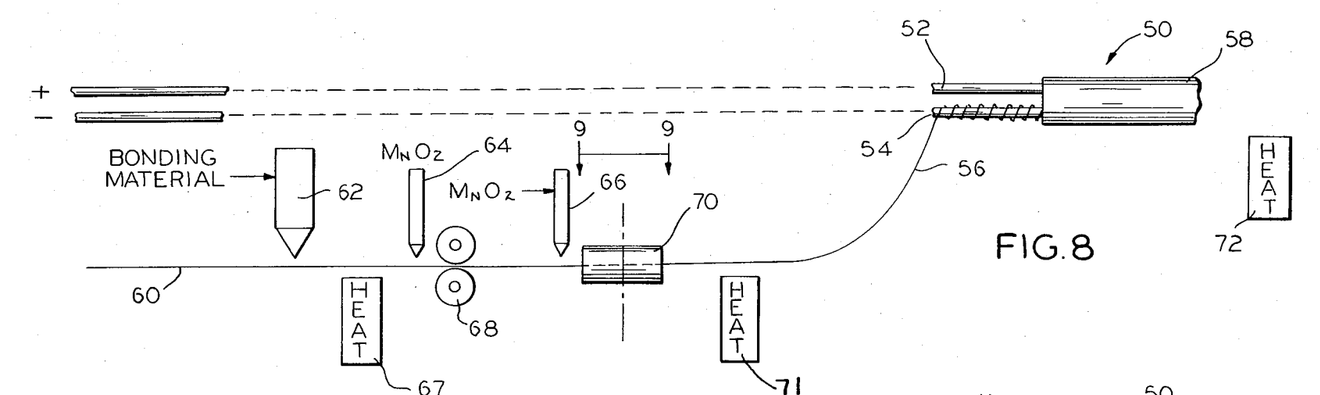
FIG. 8 is a schematic view of an alternative method of manufacturing heat sensitive cable in accordance with the present invention.
Figure 9:
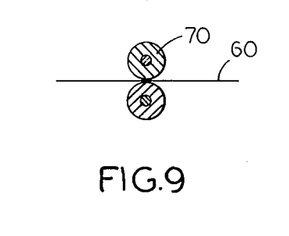
FIG. 9 is a top plan view taken along the line 9—9 of FIG. 8.

Considering the flexible outer jacket 18, it may be formed of any of a number of electrically non-conductive materials with the desired flexibility characteristics. It is contemplated that the outer jacket 18 may be formed, for instance, of a material adapted to be extruded onto the conductors 12 and 14, or of a material adapted to be heat shrunk onto the conductors 12 and 14, or of a material adapted to be wrapped onto the conductors 12 and 14. Regardless of the method of applying the material to the conductors 12 and 14, it is only necessary that the material hold the conductors 12 and 14 together under some pressure in contacting side-by-side relation and be sufficiently flexible to permit the cable to be wound on a spool 22, as shown in FIG. 3.

With respect to the method of manufacturing the cable, a pair of thermoelectric conductors is initially provided. Next, means are provided for passively self-generating a temperature representative measurable voltage between the conductors when the cable is exposed to ambient temperature. The conductors are then positioned so as to be disposed in contacting side-by-side relation. Finally, a flexible outer jacket formed of an electrically nonconductive material is applied to the conductors so that the conductors are completely surrounded by the jacket. The passive self-generating means is selected so as to include means for causing a change in the temperature representative measurable voltage with an increase or decrease in temperature at every location along the jacket. A change in the temperature representative measurable voltage under such condition is representative of a change in the ambient temperature. The passive self-generating means is also selected so as to include means for causing a change in the temperature representative measurable voltage with an increase in temperature above the prevailing ambient at any location along the jacket. With the manufacturing method of the invention, a heat sensitive cable is provided which may be utilized not only to monitor ambient temperature but also to monitor for any localized increase above ambient temperature.

As previously mentioned, the surface of the conductor is treated by coating the conductor with a manganese nitrate solution. It is preferable for the solution to comprise approximately 61 percent manganese nitrate. After the conductor has been coated, it is heated to a temperature of between 300° and 450° F. to provide an electrical insulation having a negative temperature coefficient.

While the invention is not to be construed as limited to any specific components, one practical embodiment utilizes either extruded or heat shrinkable rubber for the flexible outer jacket 18. In this embodiment, one of the two conductors 12 is 14 gauge Chromel brand wire of Hoskins Manufacturing Co., Detroit, Mich., and the other of the conductors 14 is 24 gauge Constantan brand wire available from the same company, where both of the wires have been subjected to a surface treatment process in which they have first been abrasively cleaned and then coated with a chemical, such as a manganese nitrate solution, which when heated and applied under controlled conditions results in a permanent change in the electrical resistivity of the outside surface of the wires. Specifically, the two wires are treated by dipping or otherwise coating them in a solution of 61 percent manganese nitrate and then subjecting them to temperatures of 300° to 400° F. for a short period of time in the range of approximately 3 to 5 minutes.

Referring now to FIGS. 4 through 7, an alternative embodiment of the present invention is illustrated. The heat sensitive cable 24 is preferably identical to the heat sensitive cable 10 with a single exception, i.e., the electrical insulation 26 provided on the surface of at least one of the conductors 28 and 30. As shown, the electrical insulation 26 is comprised of a powder embedded in a bonding material.

As illustrated, the surface of the conductor 28 is provided by coating the conductor 29 with a bonding material as at 32. Heat is applied to the conductor 28 as at 34 (and/or prior to application of the bonding material) and the powdered electrical insulation is applied as at 36 and 38. As will be seen, the powdered electrical insulation as at 36 and 38 is embedded in the bonding material 32 by means of rollers at 40 and 42, respectively. Heat is then applied as at 44 after the powdered electrical insulation has been embedded in the bonding material. Finally, the conductors 28 and 30 are inserted into a flexible outer jacket 46, which is preferably made of heat shrinkable material, after which heat is applied as at 48 to shrink the flexible outer jacket 46 thereby forcing the conductors 28 and 30 into intimate contact with one another.

As for the bonding material, any material capable of use within the desired temperature limits can be utilized. For instance, clear silicone rubber caulk manufactured by General Electric Company is suitable as the bonding material for many applications because it is unaffected by temperatures ranging from −65° F. to 500° F., and it is also possible to use a conductive adhesive such as Amicon CT-5047-2, C-840, or C-950 sold by the Polymer Products Division of Amicon Corporation. When a conductive adhesive is used, it is possible to provide a heavier coating on the conductors than silicone will normally permit.

With regard to the powdered electrical insulation, it is preferably heat treated manganese dioxide following the teachings in my copending patent application, Ser. No. 317,631, filed Nov. 2, 1981, now U.S. Pat. No. 4,491,822, issued Jan. 1, 1985, and divisionals thereof including my copending patent applications, Ser. Nos. 645,901, 645,908 and 646,133, all filed Aug. 29, 1984, which are incorporated herein by reference. With this material, the insulation has an insulation resistance of between approximately 3,000 and 6,000 ohms at approximately 72° F. which has been found sufficient to produce a negative temperature coefficient insulator operable over a wide temperature range.

Referring now to FIGS. 8 through 11, another alternative embodiment of the present invention is illustrated. The heat sensitive cable 50 is comprised of thermoelectrically dissimilar conductors 52 and 54, and electrical insulation as at 56 applied on the surface of at least one of the conductors 54, and a flexible outer jacket 58. As shown, the electrical insulation as at 56 is applied in a unique fashion.

In particular, the surface of the conductor 54 is provided with an electrical insulation by utilizing a flexible wrap material 60. The flexible wrap material 60, which can be any flexible material but preferably on that is absorbant, is covered with a bonding material as at 62 and the bonding material is embedded with a powdered electrical insulation as at 64 and 66. Thereafter, the conductor 54 is wrapped with the flexible wrap material 60.

Once again, the bonding material as at 62 is preferably a temperature resistant adhesive and the powdered electrical insulation as at 64 and 66 is preferably heat treated manganese dioxide. The flexible wrap material 60 may be heated before and/or after application of the bonding material as at 67, it is then rolled as at 68 and 70 immediately after application of the powdered electrical insulation as at 64 and 66, respectively, and heat is applied subsequent to rolling as at 71. After the flexible wrap material 60 has been prepared, it is then wrapped about the conductor 54, the conductors 52 and 54 are inserted in a flexible outer jacket 58 of heat shrinkable material, and heat is applied as at 72.

Figures 10, 11:
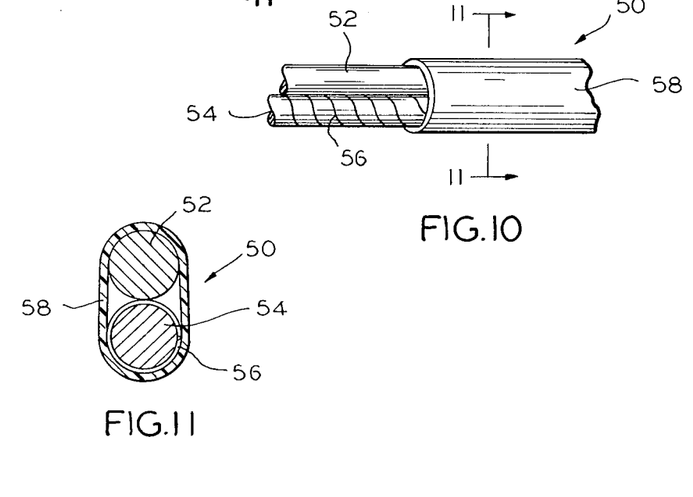
FIG. 10 is an elevational view of a section of heat sensitive cable manufactured in accordance with the method of FIG. 8.
FIG. 11 is a cross sectional view taken along the line 11—11 of FIG. 10.

As shown in FIG. 10, the electrical insulation 56 need not totally cover the outer surface of the conductor 54. It is only necessary that the treated flexible wrap material 60 comprising the electrical insulation 56 be wrapped sufficiently close together to maintain the surfaces of the conductors 52 and 54 out of contact with one another. As long as this condition is met, the cable 50 will function in the intended fashion.

Figures 12, 13, 14:
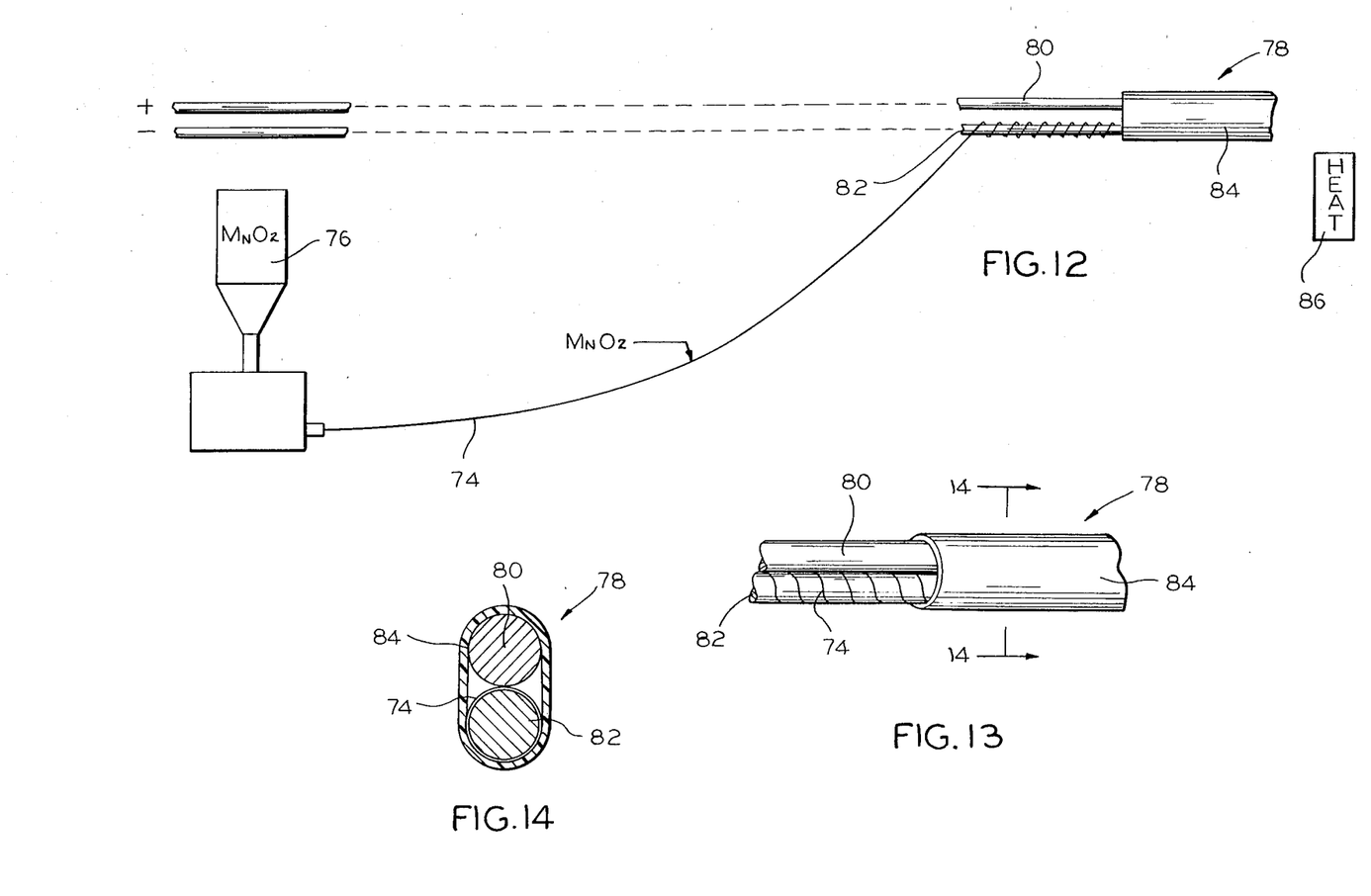
FIG. 12 is a schematic view of another alternative method of manufacturing heat sensitive cable in accordance with the present invention.
FIG. 13 is an elevational view of a section of heat sensitive cable manufactured in accordance with the method of FIG. 12.
FIG. 14 is a cross sectional view taken along the line 14—14 of FIG. 13.

Referring now to FIGS. 12 through 14, still another alternative embodiment of the present invention is illustrated. This embodiment is similar to the embodiment discussed in connection with FIGS. 8 through 11, but differs in that the flexible wrap material which is treated with bonding material and heat treated manganese dioxide in FIG. 8 has been replaced by a wire 74 formed of heat treated manganese dioxide as at 76. In other respects the cable 78 is essentially the same as the cable 50 in FIGS. 8 through 11.

In particular, the cable 78 is comprised of a pair of thermoelectrically dissimilar conductors 80 and 82. The wire 74, which may be manufactured in accordance with any desired technique, e.g., the continuous casting method disclosed in U.S. Pat. No. 3,881,541, is then wrapped about the conductor 82, the conductors 80 and 82 are inserted into a flexible outer jacket 84 of heat shrinkable material, and heat is applied as at 86 to complete the manufacturing process. When this has been done, the cable 78 will function in like fashion to the cable 50 in FIGS. 8 through 11.

Figure 15:
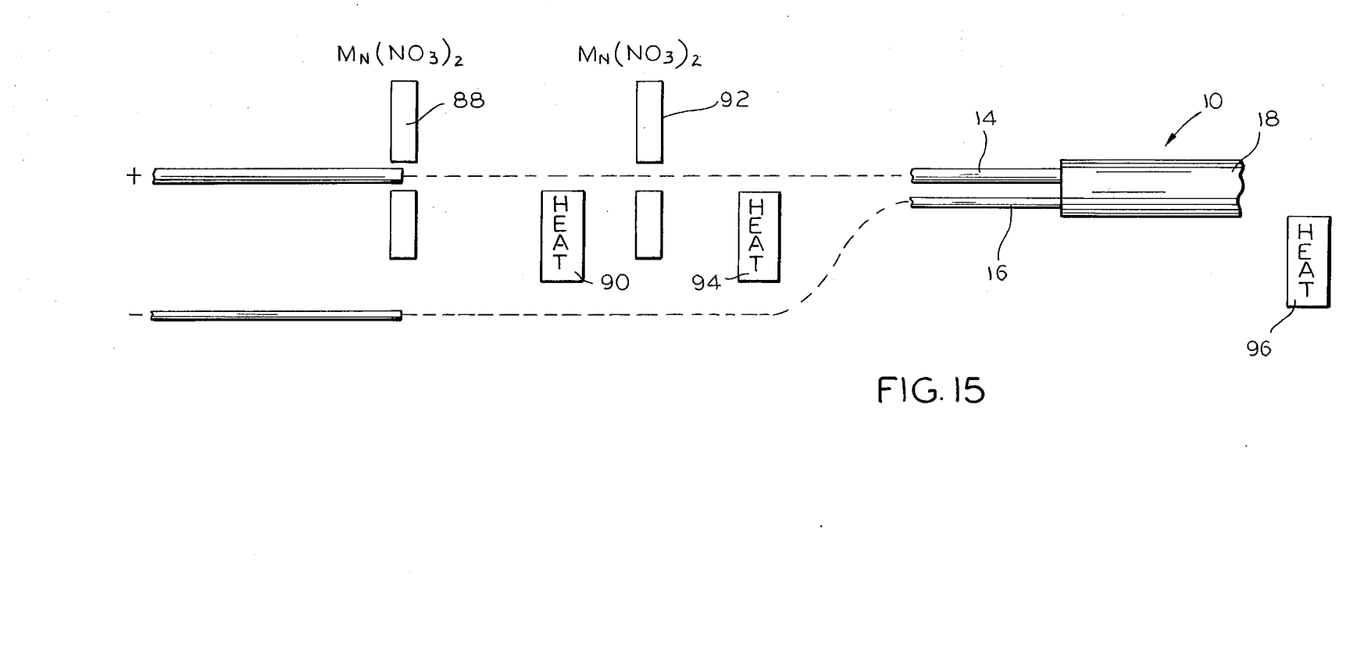
FIG. 15 is a schematic view of still another alternative method of manufacturing heat sensitive cable in accordance with the present invention.

Finally, FIG. 15 illustrates one method of manufacturing the heat sensitive cable 10 discussed in connection with FIGS. 1 through 3. It will be seen that the cable 10 can be formed by applying the manganese nitrate solution (prepared as previously discussed) to at least one of the conductors 14 of the pair of thermoelectrically dissimilar conductors 14 and 16, and this can be done by sponging on the manganese nitrate solution as at 88, then applying heat as at 90, and again sponging on manganese nitrate solution as at 92, and then applying heat as at 94, and these steps, i.e., sponging on manganese nitrate solution and thereafter heating, can be used once, twice, or as many times as desired to build up a coating of the desired thickness in assembly line fashion. When the coating has been applied to the conductor 14, the conductors 14 and 16 are inserted into the flexible outer jacket 18 of heat shrinkable material and heat is applied as at 96 to force the conductors 14 and 16 into intimate contact.

Still referring to FIG. 15, it will be observed that the positive conductor 14 is larger in diameter than the negative conductor 16. This is done to facilitate wiring the cable to suitable monitoring equipment by assuring that even untrained personnel will be able to visually identify the positive conductor and thereafter attach it to the positive terminal of the equipment and in like fashion identify the negative conductor and attach it to the negative terminal, particularly when it is considered that the positive and negative conductors will usually be the same color. When it is considered that the size of the conductors can be as small as approximately 0.012 inches, the advantage of providing a visibly larger diameter positive conductor will be apparent.

With regard to coating the surface of one or both conductors with an electrical insulation, the sole criteria is to apply a coating that remains ductile. In other words, the coating is provided with a thickness wherein the cable is capable of being bent around a small diameter, e.g., one-half to one inch in diameter without cracking or otherwise impairing the surface coating of electrical insulation. Depending on the diameter of the conductors, the coating will be thicker or thinner to achieve this result.

With the present invention, a heat sensitive cable has been provided which is capable of generating a measurable voltage when exposed to a temperature of, e.g., 72° F. The voltage measured is representative of that temperature (ambient) and the thermoelectric output of the cable or a section thereof when exposed to a higher temperature will generate a voltage representative of the higher temperature. Moreover, the heat sensitive cable is capable of generating a measurable and predictable voltage as the ambient to which the entire length is exposed is raised above or reduced below 72° F., e.g., a temperature between around −20° F. and 500° F. or higher depending upon the limitations of the materials being used. The voltage measured is representative of that temperature (a new ambient) and the thermoelectric output of the cable or a section thereof when exposed to a higher temperature would again generate a voltage representative of the higher temperature. Therefore, the heat sensitive cable may be utilized not only to monitor ambient temperature but also to monitor for any localized increase above ambient temperature, and the exact location along the cable where any localized increase occurs can be located electronically.

As previously mentioned, the conductors include chemically treated surfaces, preferably treated with a solution of manganese nitrate, to provide a permanent insulation having a high negative temperature coefficient. The thermoelectric conductors when placed in contacting side-by-side relation along their entire axial length and held firmly together by means of the flexible outer jacket over their entire axial length, as required for a specific application or measurement, will generate a voltage representative of the highest temperature along the length of the cable. Additionally, the cable may be provided with a continuous metallic sheath for certain applications in accordance with the teachings of U.S. Pat. No. 3,737,997.

As will be appreciated, the heat sensitive cable of the present invention will constantly generate a measurable voltage. This voltage is usable with conventional, inexpensive pyrometers, analog meters, digital readout indicators, strip chart recorders, temperature controllers and transmitters, state of the art microprocessor based data loggers, calculating data loggers, programmable controllers, etc. Further, with the use of conventional time domain reflectometers and electronic circuitry, the exact location along the cable where the maximum temperature exists may be located.

While all of the embodiments illustrated in the drawings utilize a pair of conductors, it will be appreciated that one or more additional conductors may also be provided. Such an additional conductor, whether insulated or non-insulated, may be useful, for instance, where a bridge network type of location device will be used. Accordingly, the present invention is to be construed as requiring a minimum of two thermoelectric conductors.

With the present invention, an inexpensive product has been provided which may be easily installed by inexperienced persons utilizing the same conventional means as used in modern home construction and wiring. The cable is also reusable (within the limits of the cable materials) and effectively provides a continuous temperature sensor. Moreover, the present invention results in the formation of a permanent, flexible, exterior surface insulation condition with a high negative temperature coefficient.

Finally, it is possible to provide an essentially continuous heat sensitive cable, i.e., the cable can be produced in lengths of thousands of feet, at a fraction of the cost of making conventional types or constructions of heat sensitive devices or cables.

With the present invention, the heat sensitive cable provides a thermocouple temperature monitoring device which consists of a pair of conductors having surfaces treated with an electrical insulation having a negative temperature coefficient within a flexible outer jacket. The cable is passive and self-generating to generate a voltage potential between the thermoelectric conductors which is indicative of the temperature existing along its entire length, or if the temperatures are unequal, at the hottest point along the cable length when subjected to external temperatures. When monitored by a high input impedance temperature device, the heat sensitive cable is capable of (1) precise, nonperishable, reproducible measurement of the temperature and (2) identification of the location of the hottest spot, and is capable of utilizing varying combinations of materials to yield various mechanical properties and temperature-voltage response curves.

Various changes coming within the spirit of the present invention may suggest themselves to those skilled in the art. Hence, it will be understood that the invention is not to be limited to the specific embodiments shown and described or the uses mentioned. On the contrary, the specific embodiments and uses are intended to be merely exemplary with the present invention being limited only by the true spirit of the scope of the appended claims.

I claim:

1. A heat sensitive cable operable in a predictable fashion over a range of temperatures for generating a measurable voltage indicative of the temperature along said cable to provide a continuous temperature sensor, comprising:

a pair of thermoelectric conductors disposed in contacting side-by-side relation, said conductors being formed of thermoelectrically dissimilar materials;

means for passively self-generating a continuous temperature representative measurable voltage between said conductors when said cable is exposed to ambient temperature without the use of an external power source, said continuous temperature representative measurable voltage being adapted for conversion into ambient temperature measured in degrees, said passive self-generating means comprising a material having a negative temperature coeffiecient associated with the surface of at least one of said conductors;

a flexible outer jacket formed of an electrically nonconductive material completely surrounding said conductors, said jacket holding said conductors firmly together substantially along their entire length;

said passive self-generating means causing an increase or decrease in said continuous temperature representative measurable voltage responsive to an associated increase or decrease in ambient temperature at every location along said cable, the change in said voltage under such condition being measurable and representative of an increase or decrease in ambient temperature and adapted for conversion into a new ambient temperature along said cable measured in degrees, said passive self-generating means also causing a change in said continuous temperature representative measurable voltage responsive to an associated increase in temperature above the prevailing ambient at any location along said cable, the change in said voltage under such condition also being measurable and representative of an increase in localized temperature and adapted for conversion into a maximum temoerature along said cable measured in degrees;

whereby said heat sensitive cable may be utilized not only to monitor ambient temperature but also to monitor for any localized increase in temperature over said range of temperatures for said cable in a predictable fashion to provide a continuous temperature sensor.

2. The heat sensitive cable as defined by claim 1 wherein said material comprising said passive self-generating means is an electrical insulation disposed on the surface of at least one of said conductors.

3. The heat sensitive cable as defined by claim 2 wherein said electrical insulation on said surface of said conductor is provided by coating said conductor with a manganese nitrate solution.

4. The heat sensitive cable as defined by claim 3 wherein said manganese nitrate solution is provided by heating manganese nitrate at a temperature of approximately 100° F. until melted and thereafter heating said melted manganese nitrate at between approximately 400° to 500° F. for approximately 3 minutes.

5. The heat sensitive cable as defined by claim 4 wherein said electrical insulation on said surface of said conductor is provided by heating said conductor after coating with said manganese nitrate solution.

6. The heat sensitive cable as defined by claim 5 wherein said conductor is coated with a solution of approximately 61 percent manganese nitrate and said conductor is heated to a temperature of between 300° and 450° F.

7. The heat sensitive cable as defined by claim 2 wherein said electrical insulation on said surface of said conductor is provided by coating said conductor with a bonding material and embedding said bonding material with a powdered electrical insulation.

8. The heat sensitive cable as defined by claim 7 wherein said electrical insulation on said surface of said conductor is provided by heating said conductor after covering said conductor with said bonding material and embedding said bonding material with said powdered electrical insulation after heating.

9. The heat sensitive cable as defined by claim 8 wherein said electrical insulation on said surface of said conductor is provided by heating said conductor after embedding said bonding material with said powdered electrical insulation.

10. The heat sensitive cable as defined by claim 9 wherein said bonding material is a temperature resistant adhesive and said powdered electrical insulation is heat treated manganese dioxide.

11. The heat sensitive cable as defined by claim 2 wherein said electrical insulation on said surface of said conductor is provided by utilizing a flexible wrap material, covering said flexible wrap material with a bonding material and embedding said bonding material with a powdered electrical insulation, said conductor being wrapped with said flexible wrap material.

12. Ihe heat sensitive cable as defined by claim 11 wherein said bonding material is a temperature resistant adhesive and said powdered electrical insulation is heat treated manganese dioxide.

13. The heat sensitive cable as defined by claim 2 wherein said electrical insulation on said surface of said conductor is provided by wrapping said conductor with a wire having a negative temperature coefficient.

14. The heat sensitive cable as defined by claim 13 wherein said wire is formed of heat treated manganese dioxide.

15. The heat sensitive cable as defined by claim 1 wherein one of said conductors is formed of a nickel/chromium alloy and the other of said conductors is formed of a copper/nickel alloy.

16. The heat sensitive cable as defined by claim 15, wherein said nickel/chromium alloy comprises approximately 90 percent nickel and 10 percent chromium and said copper/nickel alloy comprises approximately 55 percent copper and 45 percent nickel.

17. The heat sensitive cable as defined by claim 1 wherein said flexible outer jacket is formed of a material adapted to be extruded onto said conductors to hold said conductors together under pressure along their entire length.

18. The heat sensitive cable as defined by claim 1 wherein said flexible outer jacket is formed of a material adapted to be heat shrunk onto said conductors to hold said conductors together under pressure along their entire length.

19. The heat sensitive cable as defined by claim 1 wherein said flexible outer jacket is formed of a material adapted to be wrapped onto said conductors to hold said conductors together under pressure along their entire length.

20. The heat sensitive cable as defined by claim 1 wherein the heat sensitive cable is operable in a predictable fashion over a range of temperatures of between around at least −20° F. and 500° F.

21. The heat senitive cable of claim 1 wherein one of said conductors is larger than another of said conductors.

22. The heat sensitive cable as defined by claim 21 wherein the larger of said conductors is the positive conductor and the smaller of said conductors is the negative conductor.

23. A method of manufacturing a heat sensitive cable operable in a predictable fashion over a range of temperatures for generating a measurable voltage indicative of the temperature along said cable to provide a continuous temperature sensor, comprising:

providing a pair of thermoelectric conductors adapted to be disposed in contacting side-by-side relation, said conductors being formed of thermoelectrically dissimilar materials;

providing means for passively self-generating a continuous temperature representative measurable voltage between said conductors when said cable is exposed to ambient temperature without the use of an external power source, said continuous temperature representative measurable voltage being adapted for conversion into ambient temperature measured in degrees, said passive self-generating means comprising a material having a negative temperature coefficient associated with the surface of at least one of said conductors;

positioning said pair of thermoelectric conductors so as to be disposed in contacting side-by-side relation; and applying a flexible outer jacket to said conductors formed of an electrically non-conductive material so that said conductors are completely surrounded by said jacket and said jacket is holding said conductors firmly together substantially along their entire length;

said passive self-generating means being selected so as to cause an increase or decrease in said continuous temperature representative measurable voltage responsive to an associated increase or decrease in ambient temperature at every location along said cable, the change in said voltage under such condition being measurable and representative of an increase or decrease in ambient temperature and adapted for conversion into a new ambient temperature along said cable measured in degrees, said passive self-generating means also being selected so as to cause a change in said continuous temperature representative measurable voltage responsive to an associated increase in temperature above the prevailing ambient at any location along said cable, the change in said voltage under such condition also being measurable and representative of an increase in localized temperature and adapted for conversion into a maximum temperature along said cable measured in degrees:

whereby said manufacturing method provides a heat sensitive cable which may be utilized not only to monitor ambient temperature but also to monitor for any localized increase above ambient temperature over said range of temperatures for said cable in a predictable fashion to provide a continuous temperature sensor.

24. The method of manufacturing a heat sensitive cable as defined by claim 23 wherein said step of providing said material comprising said passive self-generating means includes applying an electrical insulation to the surface of at least one of said conductors.

25. The method of manufacturing a heat sensitive cable as defined by claim 24 wherein said applying step includes coating said conductor with a manganese nitrate solution.

26. The method of manufacturing a heat sensitive cable as defined by claim 25 wherein said manganese nitrate solution is provided by heating manganese nitrate at a temperature of approximately 100° F. until melted and thereafter heating said melted manganese nitrate at between approximately 400° to 500° F. for approximately 3 minutes.

27. The method of manufacturing a heat sensitive cable as defined by claim 25 wherein said applying step includes heating said conductor after coating with said manganese nitrate solution.

28. The method of manufacturing a heat sensitive cable as defined by claim 27 wherein said conductor is coated with a solution of approximately 61 percent manganese nitrate and said conductor is heated to a temperature of between 300° and 450° F.

29. The method of manufacturing a heat senitive cable as defined by claim 24 wherein said applying step includes coating said conductor with a bonding material and embedding said bonding material with a powdered electrical insulation.

30. The method of manufacturing a heat sensitive cable as defined by claim 29 wherein said applying step includes heating said conductor after covering said conductor with said bonding material, said bonding material thereafter being embedded with said powdered electrical insulation.

31. The method of manufacturing a heat sensitive cable as defined by claim 30 wherein said applying step includes heating said conductor after said bonding material has been embedded with said powdered electrical insulation.

32. The method of manufacturing a heat sensitive cable as defined by claim 31 wherein said bonding material is a temperature resistant adhesive and said powdered electrical insulation is heat treated manganese dioxide.

33. The method of manufacturing a heat sensitive cable as defined by claim 24 wherein said applying step includes providing a flexible wrap material, covering said flexible wrap material with a bonding material, embedding said bonding material with a powdered electrical insulation, and wrapping said conductor with said flexible wrap material.

34. The method of manufacturing a heat sensitive cable as defined by claim 33 wherein said bonding material is a temperature resistant adhesive and said powdered electrical insulation is heat treated manganese dioxide.

35. The method of manufacturing a heat sensitive cable as defined by claim 24 wherein said applying step includes providing a wire having a negative temperature coefficient and wrapping said conductor with said wire.

36. The method of manufacturing a heat sensitive cable as defined by claim 35 wherein said wire is formed of heat treated manganese dioxide.

37. The method of manufacturing a heat sensitive cable as defined by claim 23 wherein one of said conductors is a nickel/chromium alloy and the other of said conductors is a copper/nickel alloy.

38. The method of manufacturing a heat sensitive cable as defined by claim 37 wherein said nickel/chromium alloy comprises approximately 90 percent nickel and 10 percent chromium and said copper/nickel alloy comprises approximately 55 percent copper and 45 percent nickel.

39. The method of manufacturing a heat sensitive cable as defined by claim 23 wherein said flexible outer jacket is applied by extruding said electrically nonconductive material onto said conductors to hold said conductors together under pressure along their entire length.

40. The method of manufacturing a heat sensitive cable as defined by claim 23 wherein said flexible outer jacket is applied by heat shrinking said electrically nonconductive material onto said conductors to hold said conductors together under pressure along their entire length.

41. The method of manufacturing a heat sensitive cable as defined by claim 23 wherein said flexible outer jacket is applied by wrapping said electrically nonconductive material onto said conductors to hold said conductors together under pressure along their entire length.

42. The method of manufacturing a heat sensitive cable as defined by claim 23 wherein the heat sensitive cable is operable in a predictable fashion over a range of temperatures of between around at least −20° F. and 500° F.

* * * * *